United States Patent
Toyama

(10) Patent No.: US 6,410,946 B1
(45) Date of Patent: Jun. 25, 2002

(54) SEMICONDUCTOR DEVICE WITH SOURCE AND DRAIN ELECTRODES IN OHMIC CONTACT WITH A SEMICONDUCTOR LAYER

(75) Inventor: Takayuki Toyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/561,940

(22) Filed: May 1, 2000

(30) Foreign Application Priority Data

May 6, 1999 (JP) .......................................... P11-126132

(51) Int. Cl.$^7$ ...................... H01L 21/338; H01L 21/203
(52) U.S. Cl. .......................... 257/194; 257/19; 257/192; 257/195; 257/196
(58) Field of Search .............................. 257/20, 24, 27, 257/192, 194, 195, 196, 280–287

(56) References Cited

U.S. PATENT DOCUMENTS 5,504,353 A * 4/1996 Kuzuhara ................... 257/194

FOREIGN PATENT DOCUMENTS

JP 3-49242 A * 3/1991 .................. 257/192

* cited by examiner

Primary Examiner—Minh Loan Tran
Assistant Examiner—Thomas L Dickey
(74) Attorney, Agent, or Firm—Sonnenschein, Nath & Rosenthal

(57) ABSTRACT

In order to reduce a contact resistance of an electrode of a semiconductor device, a metal layer is directly formed on a source area and a drain area so as to form a source electrode and a drain electrode without providing a cap layer thereunder. Consequently, a step for removing the cap layer can be eliminated, simplifying the manufacturing process for the semiconductor device.

18 Claims, 5 Drawing Sheets

SEMICONDUCTOR DEVICE WITH SOURCE AND DRAIN ELECTRODES IN OHMIC CONTACT WITH A SEMICONDUCTOR LAYER

The present application claims priority to Japanese Application No. P11-126132 filed May 06, 1999 which application is incorporated herein by reference to the extent permitted by law.

BACKGROUND OF THE INVENTION

1. Field of the Invention

The present invention relates to semiconductor devices, such as discrete devices or integrated circuit devices, and to a manufacturing method therefor.

2. Description of the Related Art

Recently, terminals used in mobile communication system, such as a mobile phone, have been actively developed so as to be compact and to have a low power consumption. Accordingly, semiconductor devices, such as transistors, composing the terminals, have also been required to have the same features as mentioned above. For example, a power amplifier for digital cellular use, which is considered to be the most important apparatus for current mobile communication, is required to be operated by a single positive power supply, and to have high efficiency at a low voltage.

Currently, one of the devices used in practice for a power amplifier is a heterojunction field-effect transistor (hereinafter referred to as HFET). A schematic structure of a conventional HFET, which performs current modulation by using a heterojunction thereof, is shown in FIG. 6.

This HFET has a laminated structure formed on a base body 11 composed of a semi-insulating gallium-arsenide (GaAs), in which a buffer layer 12 composed of GaAs, a second barrier layer 13 composed of aluminum-gallium-arsenide (AlGaAs), a channel layer 14 composed of indium-gallium-arsenide (InGaAs), and a first barrier layer 15 composed of AlGaAs are sequentially formed.

The barrier layer 13 is composed of two high resistance layers 13b with a carrier supply layer 13a therebetween, and the barrier layer 15 is composed of two high resistance layers 15b with a carrier supply layer 15a therebetween.

A gate electrode 20 is disposed on the first barrier layer 15, and at two sides of the gate electrode 20, a source electrode 18 and a drain electrode 19 are ohmically formed above the first barrier layer 15 via cap layers 16, respectively.

According to the structure described above, current between the source electrode 18 and the drain electrode 19 is modulated by a voltage applied to the gate electrode 20.

In general, as shown in FIG. 6, the HFET has a recess structure in which a thickness of the first barrier layer under the gate electrode 20 and in the vicinity thereof is designed to be thinner in many cases. Consequently, an area in the channel layer under the recess formed in the first barrier layer, in which carriers are depleted or a smaller number of carriers are present compared to the other part of the channel layer, is formed.

In the HFET having the structure thus described, by applying a positive voltage to the gate electrode, carriers are accumulated in the channel layer, and hence a channel is formed.

The HFET having the structure thus described has advantages, in theory, of superior linearities of a gate-source capacitance Cgs and a mutual conductance Gm versus a gate voltage Vg, over other devices, such as a junction field-effect transistor (hereinafter referred to as JFET) and a Schottky junction field-effect transistor (hereinafter referred to as MESFET). This is of great advantage in order to achieve high efficiency in power amplifiers.

In the HFET having the structure thus described, current flowing into the drain electrode 19 reaches the channel layer 14 after passing through the cap layer 16 disposed under the drain electrode 19 and the first barrier layer 15, and then the current flows into the source electrode 18 after passing along the channel layer 14 to a point below the source electrode 18 and passing through the first barrier layer 15 and the cap layer 16 disposed under the source electrode 18.

The heavily doped cap layers 16 disposed under the drain electrode 19 and the source electrode 18, respectively, in general function to reduce a contact resistance between a metal electrode and the high resistance layer 15b of the first barrier layer 15.

SUMMARY OF THE INVENTION

It is an object of the present invention to provide a semiconductor device having no cap layers described above and a manufacturing method therefor, in which an etching step of the cap layers for forming a gate electrode can be eliminated, that is, manufacturing steps can be reduced.

In one aspect of the present invention, a semiconductor device comprises a base body, a channel layer formed on the base body, a first carrier supply layer formed on the channel layer for supplying carriers into the channel layer, in which the first carrier supply layer has a wider band cap than that of the channel layer, a first semiconductor layer formed on the first carrier supply layer and in ohmic contact with a source electrode and a drain electrode, and a gate electrode formed on the first semiconductor layer, wherein at least one of the source electrode and the drain electrode is in direct contact with the first semiconductor layer, and a doped area doped with an impurity having an opposite conductivity to that of the carriers is formed in the first semiconductor layer under the gate electrode.

The semiconductor device described above may further comprise a second carrier supply layer between the base body and the channel layer for supplying carriers into the channel layer, in which the second carrier supply layer has a wider band cap than that of the channel layer.

The source electrode and the drain electrode may be formed by an alloying treatment, and alloyed layers of the source electrode and the drain electrode may extend to the vicinity of the channel layer by the alloying treatment.

A thickness of at least one of the source electrode and the drain electrode may not be less than a depth from the top surface of the layers formed on the base body to the upper surface of the channel layer, and may not be more than 3,000 Å.

The channel layer may comprise indium-gallium-arsenide, and the first carrier supply layer may comprise aluminum-gallium-arsenide.

A thickness of the first semiconductor layer on which the gate electrode is formed may be less than those of the first semiconductor layer on which the source electrode and the drain electrode are formed.

The semiconductor device may further comprise a second semiconductor layer composed of the same material as that of the first semiconductor layer and formed between the carrier supply layer and the channel layer.

The semiconductor device of the present invention may further comprise a third semiconductor layer composed of the same material as that of the first semiconductor layer and formed between the second carrier supply layer and the channel layer, and a fourth semiconductor layer composed of the same material as that of the first semiconductor layer and formed between the second carrier supply layer and the base body.

In another aspect of the present invention, a semiconductor device comprises a semi-insulating base body, a buffer layer formed on the base body and composed of the same material as that of the base body, a channel layer formed on the buffer layer, a first carrier supply layer formed on the channel layer for supplying carriers into the channel layer, in which the first carrier supply layer has a wider band cap than that of the channel layer, a first semiconductor layer formed on the first carrier supply layer and in ohmic contact with a source electrode and a drain electrode, and a gate electrode formed on the first semiconductor layer, wherein at least one of the source electrode and the drain electrode is in direct contact with the first semiconductor layer, and a doped area doped with an impurity having an opposite conductivity to that of the carrier is formed in the first semiconductor layer under the gate electrode.

The semiconductor device described above may further comprise a second carrier supply layer between the buffer layer and the channel layer for supplying carriers into the channel layer, in which the second carrier supply layer has a wider band cap than that of the channel layer.

The source electrode and the drain electrode may be formed by an alloying treatment, and alloyed layers of the source electrode and the drain electrode may extend to the vicinity of the channel layer by the alloying treatment.

A thickness of at least one of the source electrode and the drain electrode may not be less than a depth from the top surface of the layers formed on the base body to the upper surface of the channel layer, and may not be more than 3,000 Å.

The channel layer may comprise indium-gallium-arsenide, and the first carrier supply layer may comprise aluminum-gallium-arsenide.

A thickness of the first semiconductor layer on which the gate electrode is formed may be less than those of the first semiconductor layer on which the source electrode and the drain electrode are formed.

The semiconductor device may further comprise a second semiconductor layer composed of the same material as that of the first semiconductor layer and formed between the carrier supply layer and the channel layer.

The semiconductor device may further comprise a third semiconductor layer composed of the same material as that of the first semiconductor layer and formed between the second carrier supply layer and the channel layer, and a fourth semiconductor layer composed of the same material as that of the first semiconductor layer and formed between the second carrier supply layer and the buffer layer.

In still another aspect of the present invention, a method for manufacturing a semiconductor device comprises the steps of forming a channel layer on a base body, forming a carrier supply layer on the channel layer for supplying carriers into the channel layer, in which the carrier supply layer has a wider band cap than that of the channel layer, forming a semiconductor layer on the carrier supply layer, in which the semiconductor layer is in ohmic contact with a source electrode and a drain electrode, forming an insulating layer on the semiconductor layer, providing a first opening in the insulating layer, introducing an impurity having an opposite conductivity to the carrier into the semiconductor layer via the first opening, forming a gate electrode on the semiconductor layer at which the impurity is introduced, providing second openings in the insulating layer, and forming the source electrode and the drain electrode on the semiconductor layer at which the second openings are provided in the insulating layer.

The method for manufacturing the semiconductor device described above may further comprise a step of alloying the source electrode and the drain electrode.

The method for manufacturing the semiconductor device may further comprise a step of alloying the source electrode and the drain electrode so as to form alloyed layers of the source electrode and the drain electrode in the vicinity of the channel layer.

As described above, in the semiconductor device of the present invention, an ohmic electrode ohmically connected to a high resistance layer composed of an AlGaAs compound, such as AlGaAs or GaAs, such as the source electrode and the drain electrode in the embodiment described above, has a structure in which the electrode is in direct contact with the high resistance layer without providing a cap layer thereon as shown in FIG. 6, whereby the structure can be simplified.

In addition, in the manufacturing method according to the present invention, an ohmic electrode ohmically connected to a high resistance layer composed of an AlGaAs compound, such as AlGaAs or GaAs, such as a source and a drain electrode for a HFET, can be formed directly on the high resistance layer without providing a cap layer thereon as in those formed conventionally, whereby manufacturing steps can be reduced, and concomitant with this reduction in steps, the rejection rate of the products can be reduced, and productivity can be improved.

Furthermore, since a step of ion implantation for compensating ohmic characteristics or a step of etching a cap layer can be eliminated, the manufacturing process can be further simplified.

DESCRIPTION OF THE PREFERRED EMBODIMENTS

Figure 1:
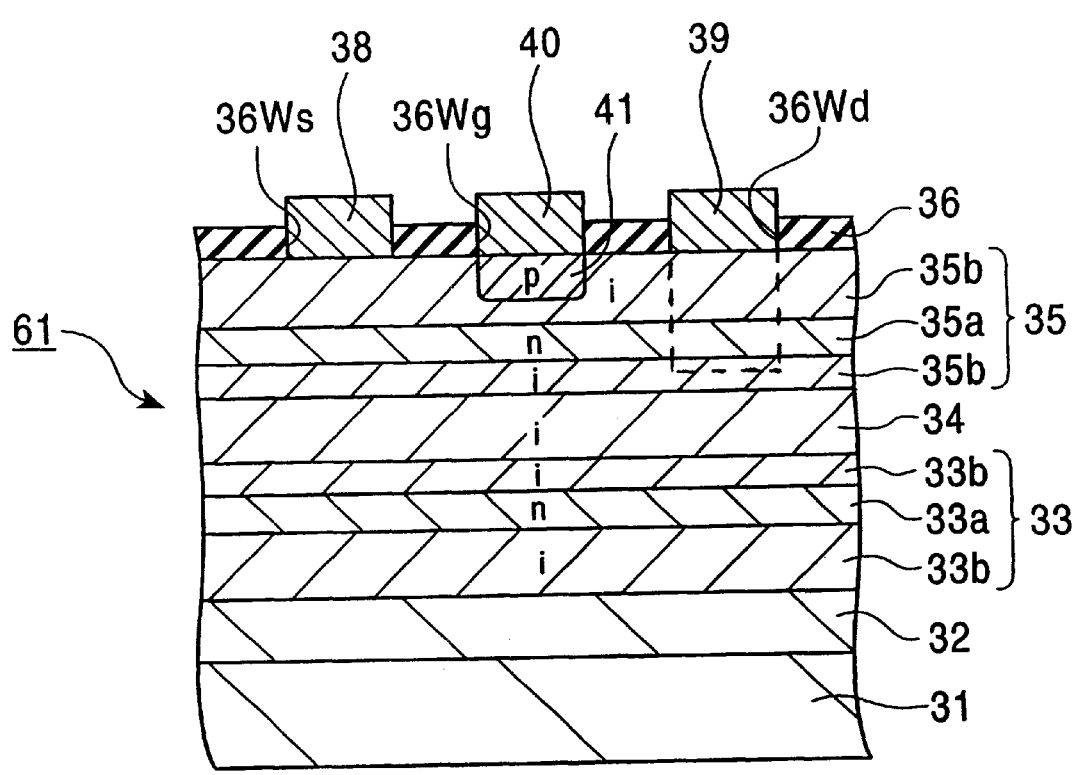
FIG. 1 is a schematic structure of an example of a semiconductor device of the present invention.

An example of embodiments of a semiconductor device according to the present invention will be described. FIG. 1 is a schematic cross-sectional view of an example of the semiconductor device in which a heterojunction field-effect transistor (HFET) is formed on a semiconductor substrate 61; however, the semiconductor device of the present invention is not limited to the example mentioned above.

In the example, the semiconductor substrate 61 is formed in a laminated structure, for example, composed of a buffer layer 32 composed of gallium arsenide (GaAs) epitaxially grown without being doped with impurities, that is, an undoped GaAs, formed on a base body 31 composed of a semi-insulating GaAs single crystal, and on the buffer layer 32, a second barrier layer 33 composed of a group III-V compound semiconductor, a channel layer 34, and a first barrier layer 35 are sequentially formed by epitaxial growth. 16 Then, on the first barrier layer 35, an insulating layer 36 composed of, for example, silicon nitride (SiN) is formed to a thickness of approximately 300 nm.

Openings 36Wg, 36Ws, and 36Wd are provided in the insulating layer 36 at which a gate portion, a source electrode portion, and a drain electrode portion are to be formed, respectively. A heavily doped area 41 for forming the gate portion is formed under the opening 36Wg, a gate electrode 40 is ohmically formed on the heavily doped area 41, and a source electrode 38 and a drain electrode 39 are ohmically and directly formed on a high resistance semiconductor layer 35b at which the openings 37Ws and 37Wd are provided, respectively.

The second barrier layer 33 mentioned above is preferably composed of a semiconductor having a wider band cap than that of a semiconductor composing the channel layer 34, for example, an $Al_xGa_{1-x}As$ mixed crystal, and a composition ratio x of aluminum is set to be $0.2 \leq x \leq 0.3$.

The second barrier layer 33 has a laminated structure, in which an undoped high resistance layer 33b having a thickness of, for example, approximately 200 nm, an approximately 4 nm-thick carrier supply layer 33a heavily doped, for example, at approximately $1.0 \times 10^{18}/cm^3$ to $5.0 \times 10^{18}/cm^3$ with a first conductive type substance, i.e., an n-type impurity, such as silicon, and a high resistance layer 33b as described above, are sequentially formed on the base body 31.

The channel layer 34, which forms a current passage between the source electrode 38 and the drain electrode 39, is composed of an undoped semiconductor having a narrower band cap than that of semiconductors composing the first barrier layer 35 and the second barrier layer 33. The channel layer 34 is preferably composed of, for example, an $In_yGa_{1-y}As$ mixed crystal, and the composition ratio y of indium is set to be $0.1 \leq y \leq 0.2$.

The first barrier layer 35 is composed of a semiconductor having a wider band cap than that of a semiconductor composing the channel layer 34. For example, the first barrier layer is preferably composed of $Al_xGa_{1-x}As$, and in this case, the composition ratio x of aluminum is set to be $0.2 \leq x \leq 0.3$.

The first barrier layer 35 has a laminated structure, in which the undoped high resistance layer 35b having a thickness of, for example, approximately 2 nm, an approximately 4 nm-thick carrier supply layer 35a heavily doped, for example, at approximately $1.0 \times 10^{18}/cm^3$ to $5.0 \times 10^{18}/cm^3$ with an n-type impurity, such as silicon, and an approximately 100 nm-thick high resistance layer 35b as described above are sequentially formed on the channel layer 34.

The insulating layer 36 is formed on the upper surface of the high resistance layer 35b and the opening 36Wg is provided in the insulating layer 36 at the gate portion, and then the heavily doped area 41 is formed by diffusing a second conductive type substance, i.e., a p-type impurity, such as zinc, in the high resistance layer 35b through the opening 36Wg. In addition, a recess (not shown) having a predetermined depth may be formed at the gate portion in the high resistance layer 35b.

Furthermore, the gate electrode 40, which is a laminate composed of, for example, titanium, platinum, and gold formed sequentially, is ohmically formed on the high resistance layer 35b through the opening 36Wg.

At both sides with the gate electrode 40 therebetween, the openings 36Ws and 36Wd are provided in the insulating layer 36, which are used as contact windows for the source electrode 38 and the drain electrode 39, respectively. For example, a gold-germanium alloy (AuGe), nickel (Ni), and gold (Au) are sequentially formed on the high resistance layer 35b through the openings 36Ws and 36Wd, and are then heat-treated so as to form alloys, whereby the source electrode 38 and the drain electrode 39 are formed.

According to the structure thus formed, carriers supplied from the carrier supply layer 33a of the second barrier layer 33 and from the carrier supply layer 35a of the first barrier layer 35 are accumulated in the channel layer 34.

Next, an example of a method for manufacturing the semiconductor device of the present invention shown in FIG. 1 will be described.

Figure 2:
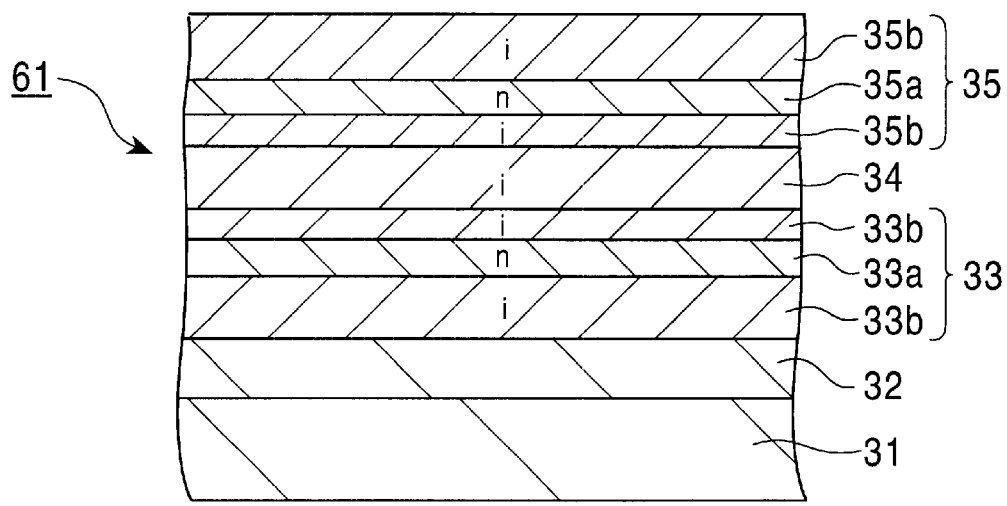
FIG. 2 is a cross-sectional view of an example of a step of a process for manufacturing a semiconductor device of the present invention.

Firstly, the semiconductor substrate 61, in which a cross-sectional view thereof is shown in FIG. 2, is formed. For manufacturing the semiconductor substrate 61, the base body 31 composed of, for example, a semi-insulating GaAs single crystal, is prepared.

The buffer layer 32 is formed on the base body 31, and then the second barrier layer 33, the channel layer 34, and the first barrier layer 35 are sequentially and epitaxially grown by, for example, metal-organic chemical vapor deposition (MOCVD) or molecular beam epitaxy (MBE).

That is, the second barrier layer 33 is formed on the base body 31. For example, the buffer layer 32 without being doped with an impurity, i.e., the buffer layer 32 composed of undoped GaAs, is epitaxially grown on the base body 31, and then, on the buffer layer 32, the undoped high resistance layer 33b composed of, for example, AlGaAs, the n-type carrier supply layer 33a doped with a first conductive type substance, such as silicon which is an n-type impurity, and the undoped high resistance layer 33b composed of, for example, AlGaAs, are sequentially grown to epitaxial layers, respectively. Subsequently, the undoped channel layer 34 composed of indium-gallium-phosphorus ((InCap) is epitaxially grown on the high resistance layer 33b, and then, on the channel layer 34, the undoped high resistance layer 35b composed of, for example, AlGaAs, the n-type carrier supply layer 35a doped with a first conductive type substance, such as silicon which is an n-type impurity, and the undoped high resistance layer 35b similar to that mentioned above are sequentially grown to epitaxial layers, respectively, whereby the first barrier layer 35 is formed.

Figure 3:
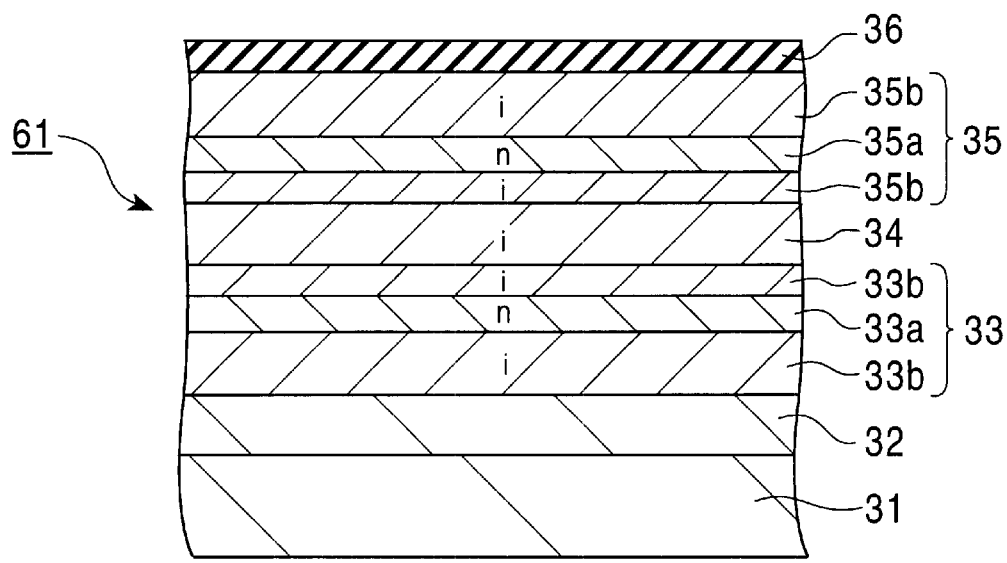
FIG. 3 is a cross-sectional view of an example of a step of a process for manufacturing a semiconductor device of the present invention.

Next, as shown in FIG. 3, the insulating layer 36 composed of, for example, SiN, is formed on the entire surface of the first barrier layer 35 by chemical vapor deposition (CVD) or the like.

Figure 4:
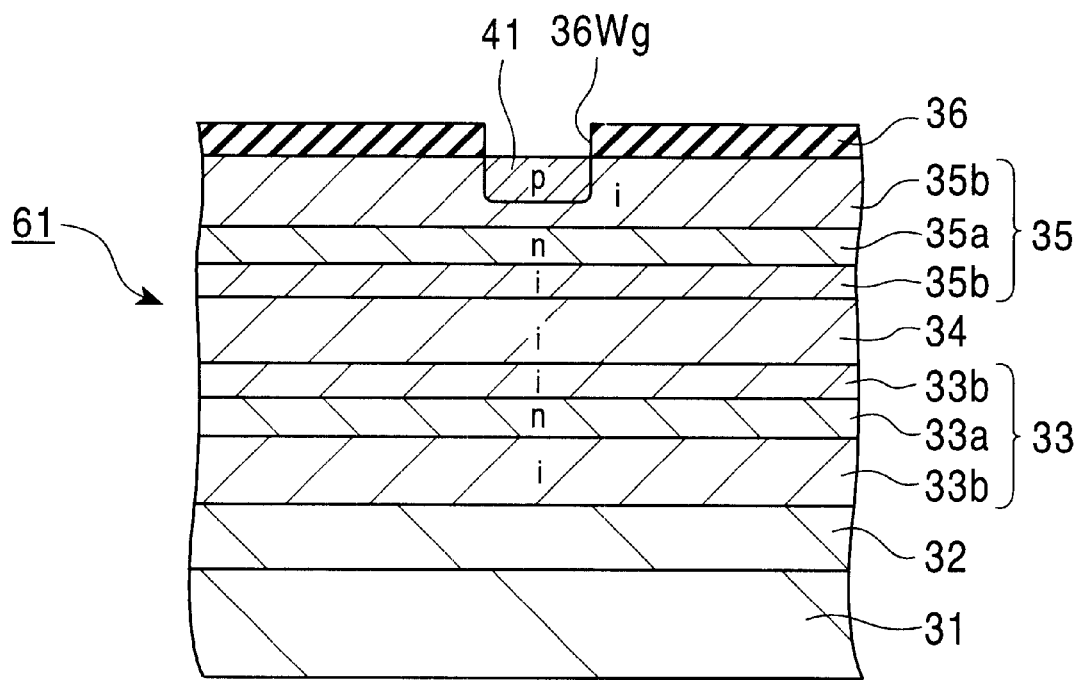
FIG. 4 is a cross-sectional view of an example of a step of a process for manufacturing a semiconductor device of the present invention.

Then, as shown in FIG. 4, pattern etching using photolithography, i.e., coating of a photoresist layer, pattern exposure, and development, are performed for patterning, and the insulating layer 36 is pattern-etched by using the patterned resist as an etching mask so as to provide the opening 36Wg at the gate portion.

The heavily doped area 41 is formed by diffusing zinc through the opening 36Wg. In addition, a recess (not shown) having a predetermined depth may be formed at the gate portion.

As shown in FIG. 1, the gate electrode 41 is formed on the high resistance layer 35b at which the opening 36Wg is provided. For forming the gate electrode 40, for example, titanium, platinum, and gold are sequentially formed in the opening 36Wg and on the insulating layer 37, and then a layered metal structure thus formed is pattern-etched so as to form the gate electrode 40.

Subsequently, the openings 36Ws and 36Wd in the insulating layer 36 are provided at areas at which the source electrode 38 and the drain electrode 39 are formed by pattern etching using photolithography.

The source electrode 38 and the drain electrode 39 are formed on the high resistance layer 35b at which the openings 36Ws and 36Wd are provided, respectively. Firstly, for example, an AuGe alloy and Ni are sequentially formed on the high resistance layer 35b and in the openings 36Ws and 36Wd, and then the source electrode 38 and the drain electrode 39 having predetermined patterns, respectively, are formed by performing pattern etching using photolithography. Subsequently, for example, alloying by heat treatment at approximately 400° C. is performed, so that the source electrode 38 and the drain electrode 39, which are in ohmic contact with the carrier supply layer 35a of the first barrier layer 35, are formed.

As has been thus described, a semiconductor device, in which a semiconductor element is composed of at least a HFET formed on the semiconductor substrate 61, is formed.

In the present invention, when an electrode including gold, germanium, and nickel, and in particular, an electrode composed of a AuGe layer having a thickness of not more than 3,000 Å and a Ni layer having a thickness of not more than 600 Å, is employed for an AlGaAs semiconductor, an electrode having superior ohmic properties can be obtained.

Figure 5:
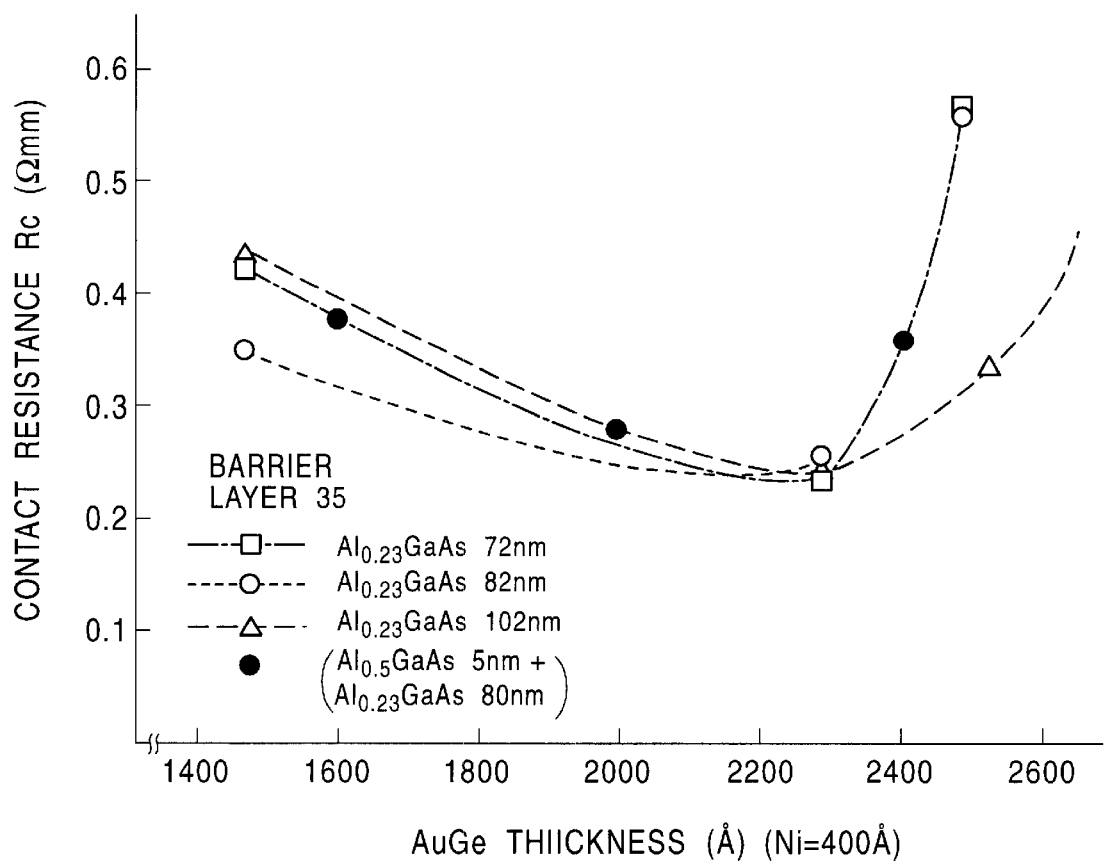
FIG. 5 is a graph showing a relationship between a contact resistance and an electrode thickness.

FIG. 5 shows measured results of a contact resistance versus thickness of AuGe. In this measurement, while the thickness of the Ni layer is maintained at 400 Å, the composition and thickness of the barrier layer 35 are varied. In FIG. 5, the symbol and the symbol • indicate the measured results when the barrier layer 35 is $Al_{0.23}GaAs$ having a thickness of 72 nm and 82 nm, respectively; the symbol Δ indicates the measured results when the barrier layer 35 is $Al_{0.22}GaAs$ having a thickness of 102 nm; and the symbol indicates the measured result when the barrier layer 35 is a laminate of $Al_{0.5}GaAs$ having a thickness of 5 nm and $Al_{0.23}GaAs$ having a thickness of 80 nm.

As can be seen in FIG. 5, in order to have a contact resistance Rc at 0.4 Ω·mm or less, the vicinity of the channel is required to be alloyed and to be doped with an impurity. For the purpose mentioned above, a thickness of the AlGaAs layer is necessarily equivalent to a depth from the most top surface of AlGaAs to the upper surface of the channel layer or more. In order to suppress an increase of a contact resistance caused by excessive reaction products between gold and indium, the thickness of the AuGe layer is preferably at 3,000 Å or less.

Figure 6:
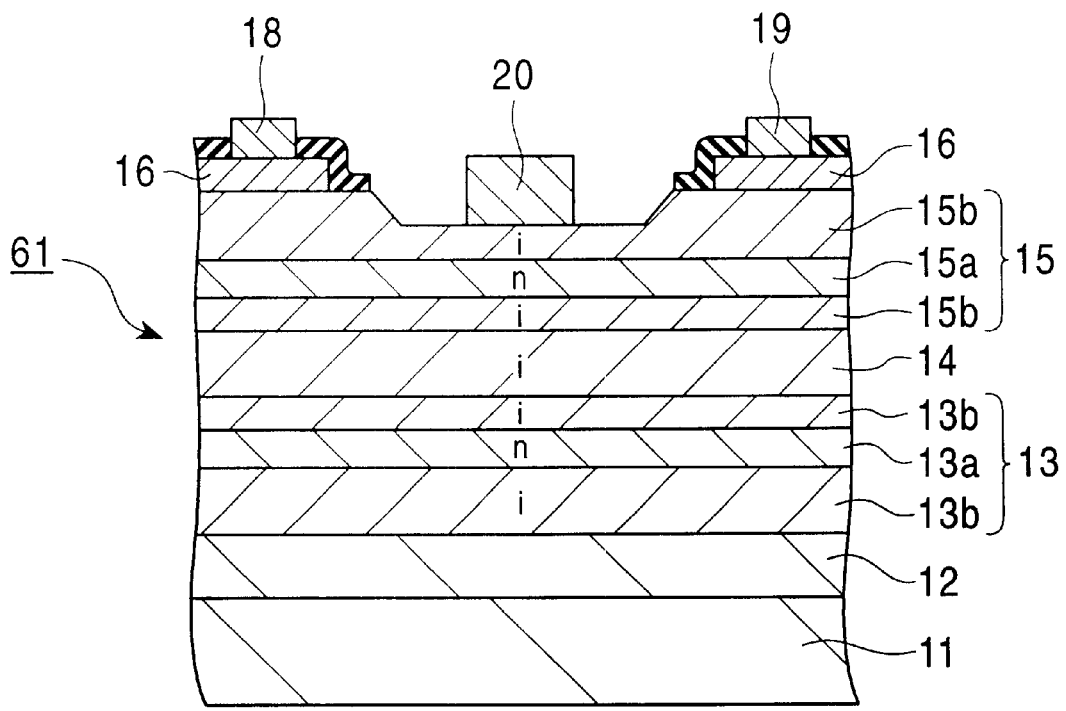
FIG. 6 is a schematic structure of a conventional HFET.

As described above, in the semiconductor device of the present invention, an ohmic electrode ohmically connected to a high resistance layer composed of an AlGaAs compound, such as AlGaAs or GaAs, such as the source electrode and the drain electrode in the embodiment described above, has a structure in which the electrode is in direct contact with the high resistance layer without providing a cap layer thereon, as shown in FIG. 6, whereby the structure can be simplified.

In addition, in the manufacturing method according to the present invention, an ohmic electrode ohmically connected to a high resistance layer composed of an AlGaAs compound, such as AlGaAs or GaAs, for example, the source and the drain electrodes for the HFET, can be formed directly on the high resistance layer without providing the cap layer thereon as those formed conventionally, whereby manufacturing steps can be reduced, and concomitant with the reduction in steps, the rejection rate of the products can be reduced, and productivity can be improved.

In the embodiments described above, the base body 31 composed of GaAs is used; however, for example, a base body composed of an InP compound may be used instead, and in this case, the semiconductor device of the present invention can be formed by growing individual layers composed of the InAs compounds.

In the figures, the case in which a first conductive type substance is an n-type and a second conductive type substance is a p-type is described; however, a structure having opposite conductivity can be formed. 34 In the figures, a single HFET is formed on the semiconductor substrate 61; however, the present invention is not limited thereto, and may be applied to semiconductor devices having various configurations in which this HFET is used as one of the circuit elements for the semiconductor device.

What is claimed is:

1. A semiconductor device comprising:
    a base body;
    a channel layer formed on the base body;
    a first carrier supply layer formed on the channel layer for supplying carriers into the channel layer, the first carrier supply layer having a wider band cap than that of the channel layer;
    a first semiconductor layer formed on the first carrier supply layer and in ohmic contact with a source electrode and a drain electrode; and
    a gate electrode formed on the first semiconductor layer;
    wherein at least one of the source electrode and the drain electrode is in direct contact with the first semiconductor layer, and
    a doped area doped with an impurity having an opposite conductivity to that of the carriers is formed in the first semiconductor layer under the gate electrode.

2. A semiconductor device according to claim 1, further comprising a second carrier supply layer between the base body and the channel layer for supplying carriers into the channel layer, the second carrier supply layer having a wider band gap than that of the channel layer.

3. A semiconductor device according to claim 1,
    wherein the source electrode and the drain electrode are formed by an alloying treatment, and
    alloyed layers of the source electrode and the drain electrode extend to the vicinity of the channel layer by the alloying treatment.

4. A semiconductor device according to claim 1,
    wherein a thickness of at least one of the source electrode and the drain electrode is not less than a depth from the top surface of the layers formed on the base body to the upper surface of the channel layer, and is not more than 3,000 Å.

5. A semiconductor device according to claim 1,
    wherein the channel layer comprises indium-gallium-arsenide, and the first carrier supply layer comprises aluminum-gallium-arsenide.

6. A semiconductor device according to claim 1,
    wherein a thickness of the first semiconductor layer on which the gate electrode is formed is less than those of the first semiconductor layer on which the source electrode and the drain electrode are formed.

7. A semiconductor device according to claim 1, further comprising a second semiconductor layer composed of the same material as that of the first semiconductor layer and formed between the carrier supply layer and the channel layer.

8. A semiconductor device according to claim 2, further comprising a third semiconductor layer composed of the same material as that of the first semiconductor layer and formed between the second carrier supply layer and the channel layer, and a fourth semiconductor layer composed of the same material as that of the first semiconductor layer and formed between the second carrier supply layer and the base body.

9. A semiconductor device according to claim 2, further comprising a second semiconductor layer composed of the same material as that of the first semiconductor layer and formed between the carrier supply layer and the channel layer, a third semiconductor layer composed of the same material as that of the first semiconductor layer and formed between the second carrier supply layers and the channel layer, and a fourth semiconductor layer composed of the same material as that of the first semiconductor layer and formed between the second carrier supply layer and the base body.

10. A semiconductor device comprising:
   a semi-insulating base body;
   a buffer layer formed on the base body and composed of the same material as that of the base body;
   a channel layer formed on the buffer layer;
   a first carrier supply layer formed on the channel layer for supplying carriers into the channel layer, the first carrier supply layer having a wider band cap than that of the channel layer;
   a first semiconductor layer formed on the first carrier supply layer and in ohmic contact with a source electrode and a drain electrode;
   a gate electrode formed on the first semiconductor layer;
   wherein at least one of the source electrode and the drain electrode is in direct contact with the first semiconductor layer, and
   a doped area doped with an impurity having an opposite conductivity to that of the carriers is formed in the first semiconductor layer under the gate electrode.

11. A semiconductor device according to claim 10, further comprising a second carrier supply layer between the buffer layer and the channel layer for supplying carriers into the channel layer, the second carrier supply layer having a wider band cap than that of the channel layer.

12. A semiconductor device according to claim 10,
   wherein the source electrode and the drain electrode are formed by an alloying treatment, and alloyed layers of the source electrode and the drain electrode extend to the vicinity of the channel layer by the alloying treatment.

13. A semiconductor device according to claim 10,
   wherein a thickness of at least one of the source electrode and the drain electrode is not less than a depth from the top surface of the layers formed on the base body to the upper surface of the channel layer, and is not more than 3,000 Å.

14. A semiconductor device according to claim 10,
   wherein the channel layer comprises indium-gallium-arsenide, and the first carrier supply layer comprises aluminum-gallium-arsenide.

15. A semiconductor device according to claim 10,
   wherein a thickness of the first semiconductor layer on which the gate electrode is formed is less than those of the first semiconductor layer on which the source electrode and the drain electrode are formed.

16. A semiconductor device according to claim 10, further comprising a second semiconductor layer composed of the same material as that of the first semiconductor layer and formed between the carrier supply layer and the channel layer.

17. A semiconductor device according to claim 11, further comprising a third semiconductor layer composed of the same material as that of the first semiconductor layer and formed between the second carrier supply layer and the channel layer, and a fourth semiconductor layer composed of the same material as that of the first semiconductor layer and formed between the second carrier supply layer and the buffer layer.

18. A semiconductor device according to claim 11, further comprising a second semiconductor layer composed of the same material as that of the first semiconductor layer and formed between the carrier supply layer and the channel layer, a third semiconductor layer composed of the same material as that of the first semiconductor layer and formed between the second carrier supply layer and the channel layer, and a fourth semiconductor layer composed of the same material as that of the first semiconductor layer and formed between the second carrier supply layer and the buffer layer.

* * * * *